United States Patent
Ingalls et al.

(10) Patent No.: US 12,066,941 B2
(45) Date of Patent: *Aug. 20, 2024

(54) METHOD FOR EXECUTING ATOMIC MEMORY OPERATIONS WHEN CONTESTED

(71) Applicant: SiFive, Inc., San Mateo, CA (US)

(72) Inventors: John Ingalls, Sunnyvale, CA (US); Wesley Waylon Terpstra, San Mateo, CA (US); Henry Cook, Berkeley, CA (US); Leigang Kou, Austin, TX (US)

(73) Assignee: SiFive, Inc., San Mateo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/961,146

(22) Filed: Oct. 6, 2022

(65) Prior Publication Data

US 2023/0033550 A1 Feb. 2, 2023

Related U.S. Application Data

(63) Continuation of application No. 17/009,876, filed on Sep. 2, 2020, now Pat. No. 11,467,962.

(51) Int. Cl.
*G06F 12/08* (2016.01)
*G01N 29/24* (2006.01)
(Continued)

(52) U.S. Cl.
CPC ..... *G06F 12/0811* (2013.01); *G01N 29/2418* (2013.01); *G06F 12/0813* (2013.01);
(Continued)

(58) Field of Classification Search
CPC .. G06F 12/08; G06F 12/0813; G06F 12/0811; G06F 12/12
See application file for complete search history.

(56) References Cited

U.S. PATENT DOCUMENTS 8,539,465 B2 * 9/2013 Levanoni ............ G06F 9/467
717/151
8,738,860 B1 5/2014 Griffin et al.
(Continued)

FOREIGN PATENT DOCUMENTS

WO WO-2012078775 A1 * 6/2012 .......... G06F 9/3004
WO 2013063484 A1 5/2013
(Continued)

OTHER PUBLICATIONS

A. Ros, M. Davari and S. Kaxiras, "Hierarchical private/shared classification: The key to simple and efficient coherence for clustered cache hierarchies," 2015 IEEE 21st International Symposium on High Performance Computer Architecture (HPCA), 2015, pp. 186-U 197.
(Continued)

*Primary Examiner* — Pierre Michel Bataille
(74) *Attorney, Agent, or Firm* — Kilpatrick Townsend & Stockton LLP

(57) ABSTRACT

Described are methods and a system for atomic memory operations with contended cache lines. A processing system includes at least two cores, each core having a local cache, and a lower level cache in communication with each local cache. One local cache configured to request a cache line to execute an atomic memory operation (AMO) instruction, receive the cache line via the lower level cache, receive a probe downgrade due to other local cache requesting the cache line prior to execution of the AMO, and send the AMO instruction to the lower level cache for remote execution in response to the probe downgrade.

20 Claims, 7 Drawing Sheets

(51) Int. Cl.

| | |
|---|---|
| *G06F 12/0811* | (2016.01) |
| *G06F 12/0813* | (2016.01) |
| *G06F 12/0846* | (2016.01) |
| *G06F 12/0891* | (2016.01) |
| *G06F 12/123* | (2016.01) |
| *H01S 5/042* | (2006.01) |
| *H01S 5/06* | (2006.01) |
| *H01S 5/10* | (2021.01) |

(52) U.S. Cl.
CPC ...... *G06F 12/0846* (2013.01); *G06F 12/0891* (2013.01); *G06F 12/123* (2013.01); *H01S 5/0427* (2013.01); *H01S 5/0612* (2013.01); *H01S 5/1042* (2013.01); *H01S 5/1096* (2013.01); *G06F 2212/1021* (2013.01)

(56) References Cited

U.S. PATENT DOCUMENTS

| | | | |
|---|---|---|---|
| 9,563,468 B1* | 2/2017 | Gschwind | ........... G06F 13/1663 |
| 10,360,168 B1 | 7/2019 | Griffin et al. | |
| 10,635,591 B1 | 4/2020 | Venkatachar et al. | |
| 11,144,480 B2* | 10/2021 | Dupont De Dinechin | .................. G06F 12/0804 |
| 2004/0093469 A1 | 5/2004 | Glasco | |
| 2004/0162949 A1 | 8/2004 | Scott et al. | |
| 2005/0177831 A1 | 8/2005 | Goodman et al. | |
| 2011/0289279 A1 | 11/2011 | Sonnier et al. | |
| 2012/0054439 A1* | 3/2012 | Walker | .................. G06F 12/084 711/E12.024 |
| 2013/0254488 A1 | 9/2013 | Kaxiras et al. | |
| 2014/0156931 A1 | 6/2014 | Krick | |
| 2014/0281243 A1 | 9/2014 | Shalf et al. | |
| 2015/0178086 A1 | 6/2015 | Hughes et al. | |
| 2015/0254183 A1* | 9/2015 | Akkawi | .............. G06F 12/0813 711/135 |
| 2016/0147679 A1 | 5/2016 | Guddeti et al. | |
| 2017/0286329 A1 | 10/2017 | Fernando | |
| 2020/0242042 A1 | 7/2020 | Svennebring et al. | |
| 2020/0371960 A1 | 11/2020 | Bhoria et al. | |
| 2020/0401412 A1 | 12/2020 | Pawlowski et al. | |

FOREIGN PATENT DOCUMENTS

| | | | | |
|---|---|---|---|---|
| WO | WO-2015134099 A1 * | 9/2015 | ......... | G06F 12/0813 |
| WO | WO-2020010540 A1 * | 1/2020 | | |

OTHER PUBLICATIONS

P. Conway, N. Kalyanasundharam, G. Donley, K. Lepak and B. Hughes, "Cache Hierarchy and Memory Subsystem of the AMD Opteron Processor," in IEEE Micro, vol. 30, No. 2, pp. 16-29, Mar.-Apr. 2010.

* cited by examiner

METHOD FOR EXECUTING ATOMIC MEMORY OPERATIONS WHEN CONTESTED

CROSS REFERENCE TO RELATED APPLICATION

This application is a continuation of U.S. Pat. No. 11,467,962, issued Oct. 11, 2022, and filed as application Ser. No. 17/009,876 on Sep. 2, 2020, which is incorporated herein by reference.

TECHNICAL FIELD

This disclosure relates to caches and in particular, methods for executing atomic memory operations with a contested cache line.

BACKGROUND

Caches are hardware and/or software components that store data (data cache) or instructions (instruction cache) so that future requests for that data or instruction can be served faster. A cache hierarchy generally includes one or more dedicated caches connected to one or more shared caches, which in turn is connected to a backing store or memory.

Caches in a shared memory multiprocessor system typically operate subject to cache coherence protocols and coherence mechanisms, which ensure that changes in the values of shared data in a data cache, for example, are propagated throughout the shared memory multiprocessor system in a timely fashion. Two common cache coherence protocols are, for example, the Modified, Exclusive, Shared, Invalid (MESI) protocol and the Modified, Shared, Invalid (MSI) protocol. In implementations, the exclusive coherence protocol state may be referred to as a unique coherence protocol state. Typically, in the modified coherence protocol state, a cache line is present only in the current cache and is dirty. That is, the data in the cache line is different from the data in a backing store or memory. In this instance, the data cache is required to write the data back to backing store at some time in the future, before permitting any other read of the (no longer valid) backing store. Upon performance of the writeback, the cache line changes to the shared coherence protocol state. In the exclusive coherence protocol state, the cache line is present only in the current data cache and is clean. That is, the data in the cache line matches the data in the backing store. The cache line may be changed to the shared coherence protocol state at any time, in response to a read request. Alternatively, the cache line may be changed to a modified coherence protocol state when writing to the cache line. In the shared coherence protocol state, the cache line may be stored in other caches of the system and is clean. That is, the data in the cache line matches the data in the backing store. The cache line may be discarded (changed to the invalid coherence protocol state) at any time. In the invalid coherence protocol state, the cache line is invalid (unused). In a writeback data cache, a store (or many stores) may be issued to a cache line(s) or cache block(s) in a "clean" (invalid, shared, or exclusive) coherence protocol state, which is classically defined to have read-only permissions. A write may only be performed freely if the cache line is established or upgraded to the modified coherence protocol state. Cache lines in the exclusive coherence protocol state also have to be upgraded to the modified coherence protocol state to be globally visible. Coherence protocol upgrades can be done using coherent mechanisms such as snooping, where each data cache monitors address lines for accesses to memory locations that they have cached, or directory, where a backing controller remembers which cache(s) have which coherence permission(s) on which cache block(s).

An atomic memory operation (AMO) is an uninterruptable read-modify-write memory operation. In other words, it is a load-add-store memory operation which has to be done in a single step. When a cache locally executes an AMO, there can be a delay from when the cache requests a cache line coherence protocol state upgrade to a 'Modified' state (where other caches are snoop probed invalidated so that the requesting cache can get the cache line Unique (Shared->Modified)) to when the cache can execute the AMO. During this delay, another cache can request the same cache line, thus snoop probing the original requesting cache. This can lead to the single cache line bouncing between two or more caches, thus reducing performance on AMOs with respect to contended cache lines.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
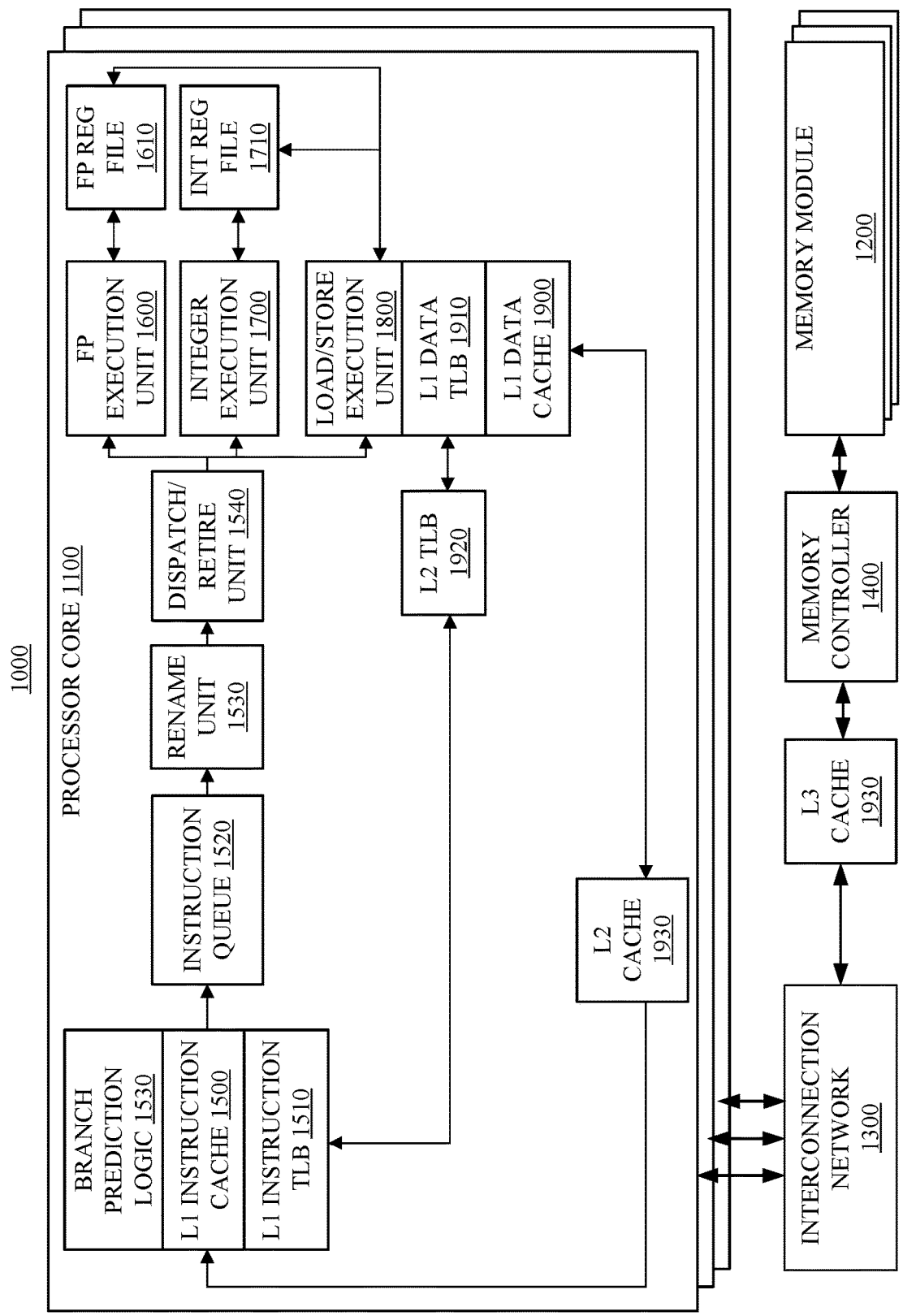
FIG. 1 is a block diagram of an example of a processing system for implementing atomic memory operations with contended cache lines in accordance with embodiments of this disclosure.

Disclosed herein are systems and methods for implementing atomic memory operations with contended cache lines. A multiprocessor processing system can include multiple processors and a shared memory. Each of processors can have or access a local cache or a L1 cache which is connected to one or more shared or remote caches, which in turn is connected to a backing store or memory (collectively a "memory hierarchy").

A processor needs to perform or execute an atomic memory operation (AMO) instruction. A local cache of the processor requests a cache line from a lower level of the memory hierarchy to execute the AMO instruction. In implementations, if the local cache is snoop probed while waiting to execute the AMO instruction, the local cache does not locally execute the AMO instruction but instead changes the AMO instruction to execute remotely in a further level of the memory hierarchy that is closer to a common root of sharing between the local cache and the other requesting cache that caused the snoop probe. In implementations, if the requested cache line is identified or determined to be a contented cache line by the further level of the memory hierarchy, then the further level of the memory hierarchy sends a contended cache line message to the local cache. The local cache sends the AMO instruction to execute remotely in a further level of the memory hierarchy in response to the contended cache line message. In implementations, determination of whether a cache line is a contended cache line can be based on a variety of factors including, but not limited to, Least Recently Used (LRU) algorithm, input from the other involved cache, inclusive cache presence bits, matching a transaction in flight or buffered from another cache, whether the L2 has the cache line at all, whether the L2 has the cache line in a Shared or Unique coherence state, matching a probe from later-level LN cache, matching an eviction from the L2 cache, a predictor table of recently-accessed cache lines that are likely to be contended, a bloom filter of cache lines that are not likely to be contended, and the like. In implementations, determination of whether a cache line is a contended cache line can use contention detection mechanisms. In implementations, determination of whether a cache line is a contended cache line can use artificial intelligence and machine learning based techniques. In implementations, determination of whether a cache line is a contended cache line can use combinations of the above.

Use of the atomic memory operations with contended cache lines techniques increase processing system performance by mitigating the ping-pong effect with respect to the requested cache line as between a local cache and a lower level memory structure. The techniques implemented are applicable to the Weak Memory Order (WMO) model in RISC-V and ARM processors, to the Total Store Order (TSO) model in x86 processors, and the like.

These and other aspects of the present disclosure are disclosed in the following detailed description, the appended claims, and the accompanying figures.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

The term "circuit" refers to an arrangement of electronic components (e.g., transistors, resistors, capacitors, and/or inductors) that is structured to implement one or more functions. For example, a circuit may include one or more transistors interconnected to form logic gates that collectively implement a logical function. For example, the processor can be a circuit.

As used herein, the terminology "determine" and "identify," or any variations thereof, includes selecting, ascertaining, computing, looking up, receiving, determining, establishing, obtaining, or otherwise identifying or determining in any manner whatsoever using one or more of the devices and methods shown and described herein.

As used herein, the terminology "example," "embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is, unless specified otherwise, or clear from context, "X includes A or B" is intended to indicate any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

It is to be understood that the figures and descriptions of embodiments have been simplified to illustrate elements that are relevant for a clear understanding, while eliminating, for the purpose of clarity, many other elements found in typical processors. Those of ordinary skill in the art may recognize that other elements and/or steps are desirable and/or required in implementing the present disclosure. However, because such elements and steps do not facilitate a better understanding of the present disclosure, a discussion of such elements and steps is not provided herein.

FIG. 1 is a block diagram of an example of a processing system 1000 for implementing atomic memory operations with contended cache lines in accordance with embodiments of this disclosure. The processing system 1000 can implement a pipelined architecture. The processing system 1000 can be configured to decode and execute instructions of an instruction set architecture (ISA) (e.g., a RISC-V instruction set). The instructions can execute speculatively and out-of-order in the processing system 1000. The processing system 1000 can be a compute device, a microprocessor, a microcontroller, or an IP core. The processing system 1000 can be implemented as an integrated circuit.

The processing system 1000 includes at least one processor core 1100. The processor core 1100 can be implemented using one or more central processing unit (CPUs). Each processor core 1100 can be connected to or be in communication with (collectively "connected to") one or more memory modules 1200 via an interconnection network 1300, a L3 cache 1350, and a memory controller 1400. The one or more memory modules 1200 can be referred to as external memory, main memory, backing store, coherent memory, or backing structure (collectively "backing structure").

Each processor core 1100 can include a L1 instruction cache 1500 which is associated with a L1 translation lookaside buffer (TLB) 1510 for virtual-to-physical address translation. An instruction queue 1520 buffers up instructions fetched from the L1 instruction cache 1500 based on branch prediction 1530 and other fetch pipeline processing. Dequeued instructions are renamed in a rename unit 1530 to avoid false data dependencies and then dispatched by a dispatch/retire unit 1540 to appropriate backend execution units, including for example, a floating point execution unit 1600, an integer execution unit 1700, and a load/store execution unit 1800. The floating point execution unit 1600 can be allocated physical register files, FP register files 1610, and the integer execution unit 1700 can be allocated physical register files, INT register files 1710. The FP register files 1610 and the INT register files 1710 are also connected to the load/store execution unit 1800, which can access a L1 data cache 1900 via a L1 data TLB 1910, which is connected tied to a L2 TLB 1920 which in turn is connected to the L1 instruction TLB 1510. The L1 data cache 1900 can be connected to a L2 cache 1930, which can be connected to the L1 instruction cache 1500. In implementations, the L2 cache 1930 can be connected to the L3 cache 1350 via the interconnection network 1300. In implementations, the L3 cache 1350 can be a shared cache.

The processing system 1000 and each element or component in the processing system 1000 is illustrative and can include additional, fewer or different devices, entities, element, components, and the like which can be similarly or differently architected without departing from the scope of the specification and claims herein. Moreover, the illustrated devices, entities, element, and components can perform other functions without departing from the scope of the specification and claims herein.

Figure 2:
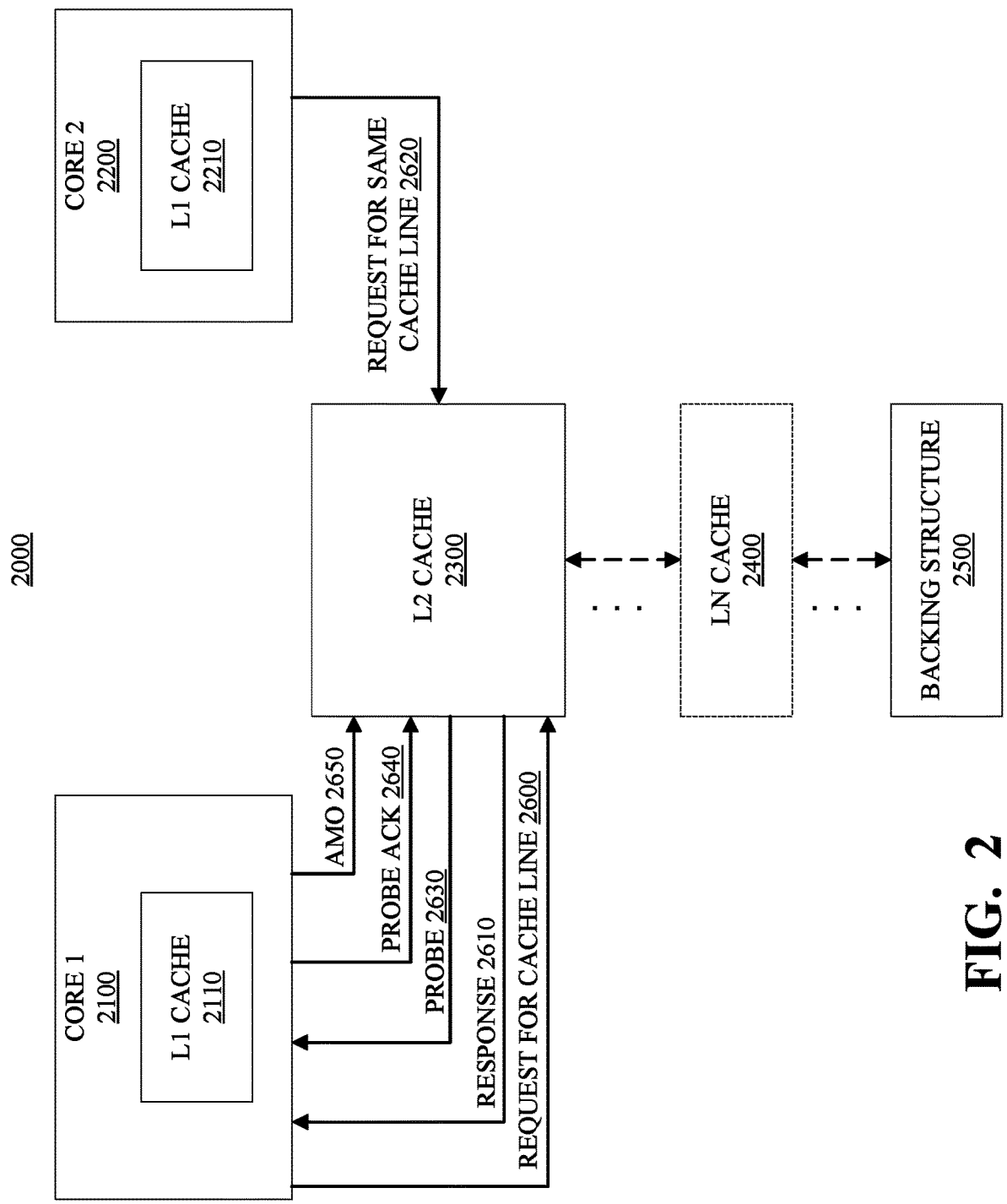
FIG. 2 is a flow diagram of an example technique or method for implementing atomic memory operations with contended cache lines in accordance with embodiments of this disclosure.

FIG. 2 is a flow diagram 2000 of an example technique or method for implementing atomic memory operations with contended cache lines in accordance with embodiments of this disclosure. The flow diagram 2000 can be implemented, for example, in the processing system 1000 of FIG. 1 and like devices and systems. The flow diagram 2000 describes communications or interactions with respect to a core 1 2100 which includes a L1 cache 2110, a core 2 2200 which includes a L1 cache 2210, a L2 cache 2300, a LN cache 2400, and a backing structure 2500. In implementations, the L1 cache 2110 is a local cache to the core 1 2100, the L1 cache 2210 is a local cache to the core 2 2200, and the L2 cache 2300 is a remote cache, shared cache, or combinations thereof to the core 1 2100 and the core 2 2200. In implementations, the backing structure 2500 can include a controller. In implementations, each of the L1 cache 2110, the L1 cache 2210, the L2 cache 2300, and the LN cache 2400 can include a defined number of cache lines.

In a starting state or sequence of the flow diagram 2000, an AMO instruction needs to be executed by the core 1 2100. The L1 local cache 2110 can request a cache line, in a modified or equivalent state (collectively "modified"), associated with the AMO instruction (2600). In implementations, the L1 local cache 2110 can request the cache line in a modified state in the event of a cache miss. In implementations, the L1 local cache 2110 can request a cache line coherence protocol state upgrade to a modified state in the event of a cache hit. The L2 cache 2300 can respond by acquiescing to the request (2610). In implementations, the L2 cache 2300 can provide the cache line in the modified state. In implementations, the L2 cache 2300 can acquiesce to the cache line coherence protocol state upgrade to the modified state. In implementations, the L2 cache 2300 can obtain the cache line from lower levels, such as the LN cache 2400 or the backing structure 2500, as needed.

Prior to execution of the AMO instruction, the core 2 2200 can request the same cache line (2620). As a result, a snoop probe can be sent to the L1 local cache 2110 invalidating the cache line at the L1 local cache 2110 (2630). The L1 local cache 2110 can send an acknowledgement of the snoop probe to the L2 cache 2300 (2640) and can send the AMO instruction to the L2 cache 2300 for remote execution of the AMO instruction (2650). In this instance, the L2 cache 2300 is the level of the cache hierarchy that is closest to the common root of sharing between the original requesting cache, the L1 cache 2110, and the other requesting cache, the L1 cache 2210, that caused the snoop probe. In implementations, the LN cache 2400, the backing structure 2500, and the like can remotely execute the AMO instruction as appropriate and applicable. For example, the L2 cache 2300 can push the AMO instruction based on a variety of factors including, but not limited to, LRU, latency, whether the L2 has the cache line at all, whether the L2 has the cache line in a Shared or Unique coherence state, matching a probe from later-level LN cache, matching an eviction from L2 cache, and the like.

Figure 3:
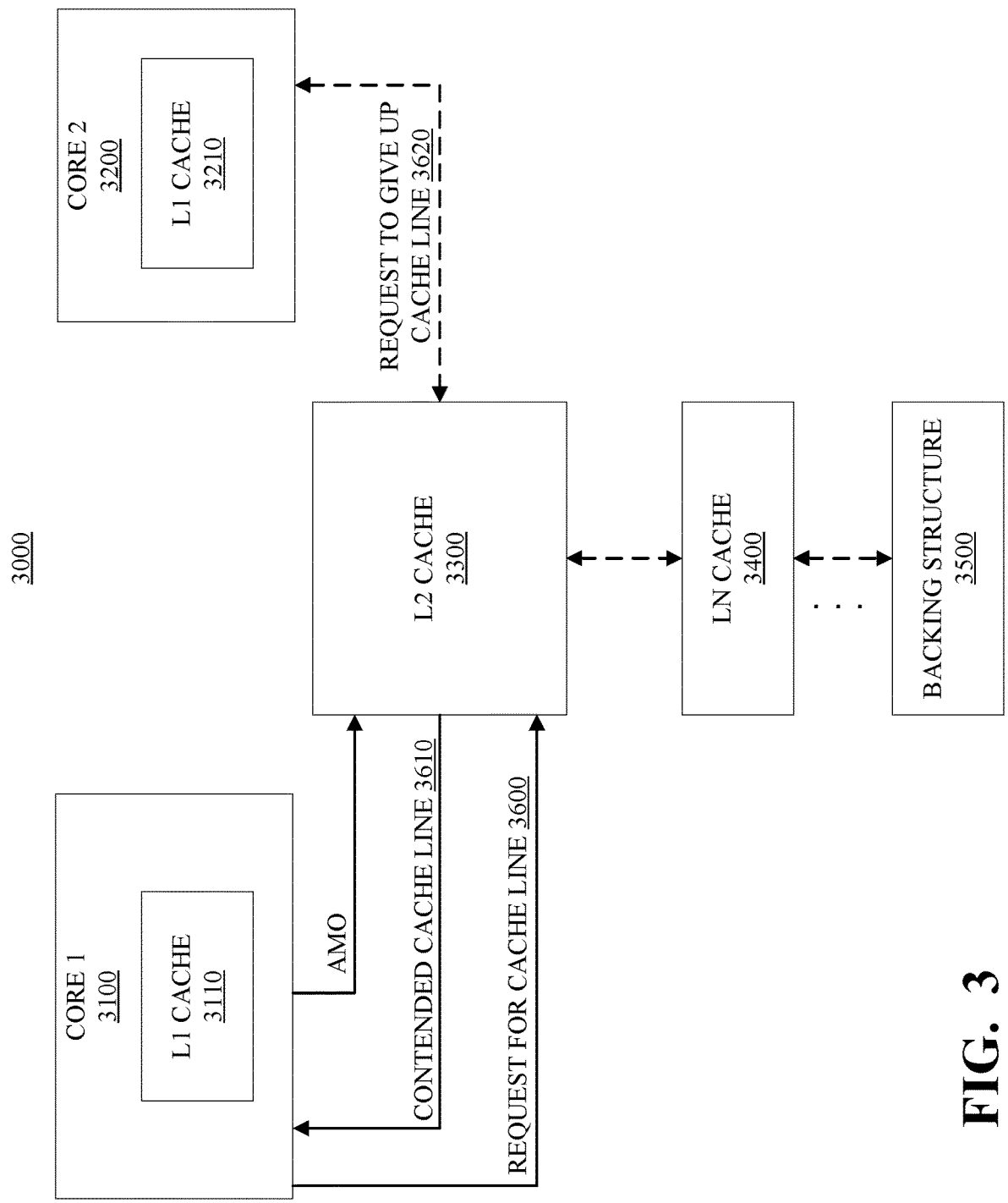
FIG. 3 is a flow diagram of an example technique or method for implementing atomic memory operations with contended cache lines in accordance with embodiments of this disclosure.

FIG. 3 is a flow diagram 3000 of an example technique or method for implementing atomic memory operations with contended cache lines in accordance with embodiments of this disclosure. The flow diagram 3000 can be implemented, for example, in the processing system 1000 of FIG. 1 and like devices and systems. The flow diagram 3000 describes communications or interactions with respect to a core 1 3100 which includes a L1 cache 3110, a core 2 3200 which includes a L1 cache 3210, a L2 cache 3300, a LN cache 3400, and a backing structure 3500. In implementations, the L1 cache 3110 is a local cache to the core 1 3100, the L1 cache 3210 is a local cache to the core 2 3200, and the L2 cache 3300 is a remote cache, shared cache, or combinations thereof to the core 1 3100 and the core 2 3200. In implementations, the backing structure 3500 can include a controller. In implementations, each of the L1 cache 3110, the L1 cache 3210, the L2 cache 3300, and the LN cache 3400 can include a defined number of cache lines.

In a starting state or sequence of the flow diagram 3000, an AMO instruction needs to be executed by the core 1 3100. The L1 local cache 3110 can request a cache line, in a modified or equivalent state (collectively "modified"), associated with the AMO instruction (3600). In implementations, the L1 local cache 3110 can request the cache line in a modified state in the event of a cache miss. In implementations, the L1 local cache 3110 can request a cache line coherence protocol state upgrade to a modified state in the event of a cache hit.

In implementations, the L2 cache 3300 can respond by stating that the requested cache line is a contended cache line and not available (3610). That is, the contended cache line message indicates that the request is denied. The L2 cache 3300 can determine that a cache line is contended based on a variety of factors including, but not limited to, LRU, latency, inclusive cache presence bits, matching a transaction in flight or buffered from another cache, whether the L2 has the cache line at all, whether the L2 has the cache line in a Shared or Unique coherence state, matching a probe from later-level LN cache, matching an eviction from L2 cache, and the like. In implementations, as part of the contented cache line determination, the L2 cache 3300 can request another cache, such as the L2 cache 3300, to give up the requested cache line (3620). In implementations, the L1 cache 3210 does not give up the requested cache line.

The L1 local cache 3110 can send the AMO instruction to the L2 cache 3300 for remote execution of the AMO instruction in response to receipt of the contented cache line message from the L2 cache 3300 (3630). In implementations, the L2 cache 3300 is the level of the cache hierarchy that is closest to the common root of sharing between the original requesting cache, the L1 cache 3110, and a retaining cache, the L1 cache 3210. In implementations, the LN cache 3400, the backing structure 3500, and the like can remotely execute the AMO instruction as appropriate and applicable. For example, the L2 cache 3300 can push the AMO instruction based on a variety of factors, including, but not limited to, LRU, latency, whether the L2 has the cache line at all, whether the L2 has the cache line in a Shared or Unique coherence state, matching a probe from later-level LN cache, matching an eviction from L2 cache, and the like.

Figure 4:
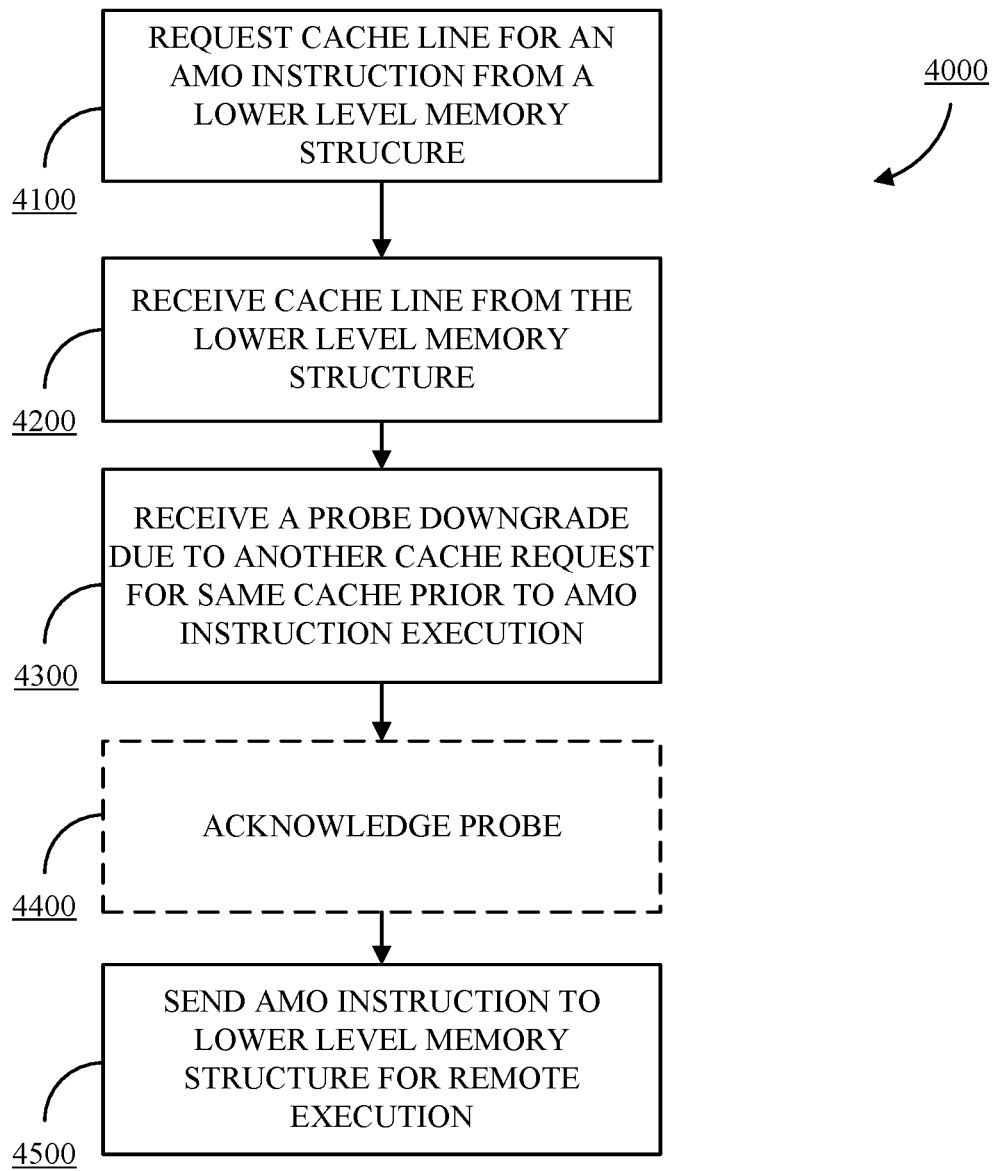
FIG. 4 is a flowchart of an example technique or method for implementing atomic memory operations with contended cache lines in accordance with embodiments of this disclosure.

FIG. 4 is a flowchart of an example technique or method 4000 for implementing atomic memory operations with contended cache lines in accordance with embodiments of this disclosure. The technique includes: requesting 4100 a cache line for an AMO instruction from a lower level memory structure; receiving 4200 the cache line from the lower level memory structure; receiving 4300 a probe downgrade due to another cache request for same cache line prior to AMO instruction execution; acknowledging 4400 the probe downgrade; and sending 4500 the AMO instruction to the lower level memory structure for remote execution. The technique 4000 can be implemented, for example, in the processing system 1000 of FIG. 1 and like devices and systems.

The technique 4000 includes requesting 4100 a cache line for an AMO instruction from a lower level memory structure. A processor or processing system needs to execute an AMO operation. A local cache can request a cache line associated or needed for execution of the AMO instruction. In implementations, the local cache can request the cache line in the event of a cache miss. In implementations, the local cache can request a cache coherence state upgrade for the cache line in the event of a cache hit.

The technique 4000 includes receiving 4200 the cache line from the lower level memory structure. The lower level memory structure can acquiesce to the request by providing the cache line to the local cache or by upgrading the cache coherence state upgrade of the cache line at the local cache.

The technique 4000 includes receiving 4300 a probe downgrade due to another cache request for the same cache line prior to AMO instruction execution. Another cache can request the same cache lane resulting in a snoop probe downgrading the cache line at the local cache or invalidating the cache line at the local cache.

The technique 4000 includes acknowledging 4400 the probe downgrade. In implementations, the local cache can attempt to negotiate with the lower level memory structure.

The technique 4000 includes sending 4500 the AMO instruction to the lower level memory structure for remote execution. The local cache can forego local execution of the AMO operation and can send the AMO instruction to the lower level memory structure for remote execution. The AMO instruction can be executed by the lower level memory structure or other memory structure which is closer to a common root of sharing between the local cache and the other requesting cache that caused the snoop probe.

Figure 5:
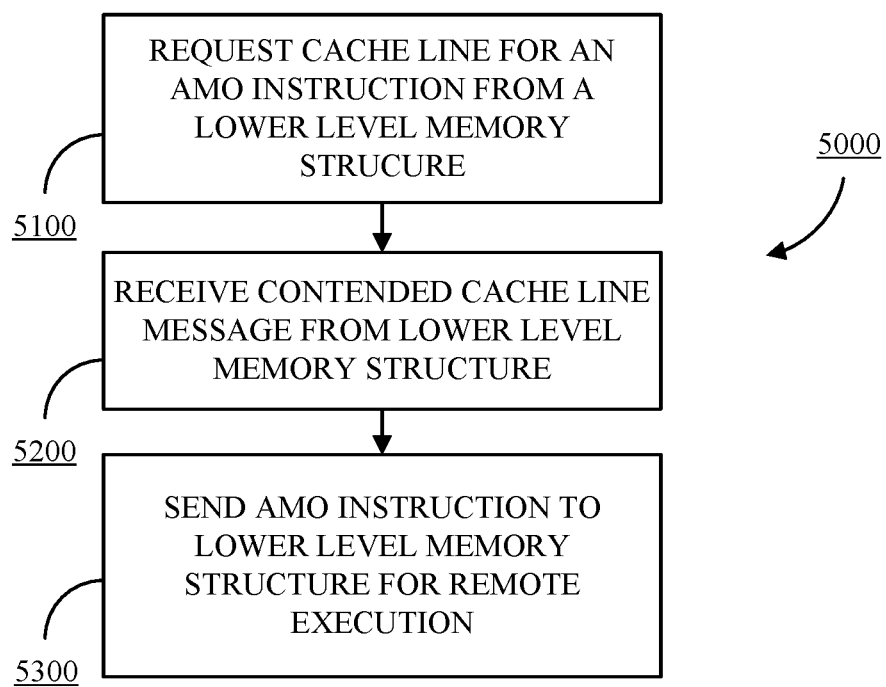
FIG. 5 is a flowchart of an example technique or method for implementing atomic memory operations with contended cache lines in accordance with embodiments of this disclosure.

FIG. 5 is a flowchart of an example technique 5000 or method for implementing atomic memory operations with contended cache lines in accordance with embodiments of this disclosure. The technique includes: requesting 5100 a cache line for an AMO instruction from a lower level memory structure; receiving 5200 a contended cache line message from the lower level memory structure; and sending 5300 the AMO instruction to the lower level memory structure for remote execution. The technique 5000 can be implemented, for example, in the processing system 1000 of FIG. 1 and like devices and systems.

The technique 5000 includes requesting 5100 a cache line for an AMO instruction from a lower level memory structure. A processor or processing system needs to execute an AMO operation. A local cache can request a cache line associated or needed for execution of the AMO instruction. In implementations, the local cache can request the cache line in the event of a cache miss. In implementations, the local cache can request a cache coherence state upgrade for the cache line in the event of a cache hit.

The technique 5000 includes receiving 5200 a contended cache line message from the lower level memory structure. The lower level memory structure can determine whether the requested cache line is a contended cache line based on a variety of factors, including, but not limited to, LRU, latency, matching a transaction in flight or buffered from the same cache or another cache, and the like. In implementations, the variety of factors can include whether another cache or memory structure which has the requested cache line will give up the requested cache line. The lower level memory structure can send a contented cache line message to the local cache based on the determination, indicating that the request is denied.

The technique 5000 includes sending 5300 the AMO instruction to the lower level memory structure for remote execution. The local cache can forego local execution of the AMO operation and can send the AMO instruction to the lower level memory structure for remote execution in response to the contended cache line message. The AMO instruction can be executed by the lower level memory structure or other memory structure. In implementations, remote execution can be performed by a memory structure which is closer to a common root of sharing between the local cache and a cache which retains the requested cache line.

Figure 6:
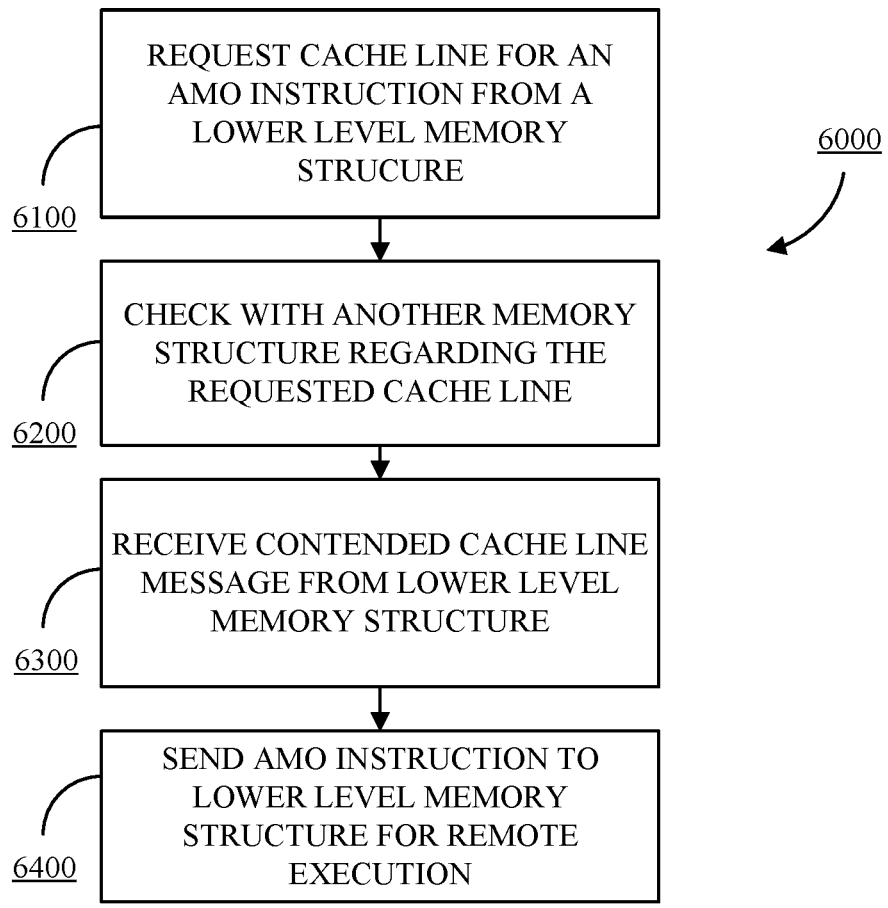
FIG. 6 is a flowchart of an example technique or method for implementing atomic memory operations with contended cache lines in accordance with embodiments of this disclosure.

FIG. 6 is a flowchart of an example technique 6000 or method for implementing atomic memory operations with contended cache lines in accordance with embodiments of this disclosure. The technique includes: requesting 6100 a cache line for an AMO instruction from a lower level memory structure; checking 6200 with other memory structure regarding the requested cache line; receiving 6300 a contended cache line message from the lower level memory structure; and sending 6400 the AMO instruction to the lower level memory structure for remote execution. The technique 5000 can be implemented, for example, in the processing system 1000 of FIG. 1 and like devices and systems.

The technique 6000 includes requesting 6100 a cache line for an AMO instruction from a lower level memory structure. A processor or processing system needs to execute an AMO operation. A local cache can request a cache line associated or needed for execution of the AMO instruction. In implementations, the local cache can request the cache line in the event of a cache miss. In implementations, the local cache can request a cache coherence state upgrade for the cache line in the event of a cache hit.

The technique 6000 includes checking 6200 with another memory structure regarding the requested cache line. The lower level memory structure can check with whether another cache or memory structure which has the requested cache line will give up the requested cache line.

The technique 6000 includes receiving 6300 a contended cache line message from the lower level memory structure. The lower level memory structure can determine whether the requested cache line is a contended cache line based on a variety of factors, including, but not limited to, LRU, latency, matching a transaction in flight or buffered from the same cache or another cache, response by the another memory structure, and the like. The lower level memory structure can send a contented cache line message to the local cache based on the determination, indicating that the request is denied.

The technique 6000 includes sending 6400 the AMO instruction to the lower level memory structure for remote execution. The local cache can forego local execution of the AMO operation and can send the AMO instruction to the lower level memory structure for remote execution in response to the contended cache line message. The AMO instruction can be executed by the lower level memory structure or other memory structure. In implementations, remote execution can be performed by a memory structure which is closer to a common root of sharing between the local cache and a cache which retains the requested cache line.

Figure 7:
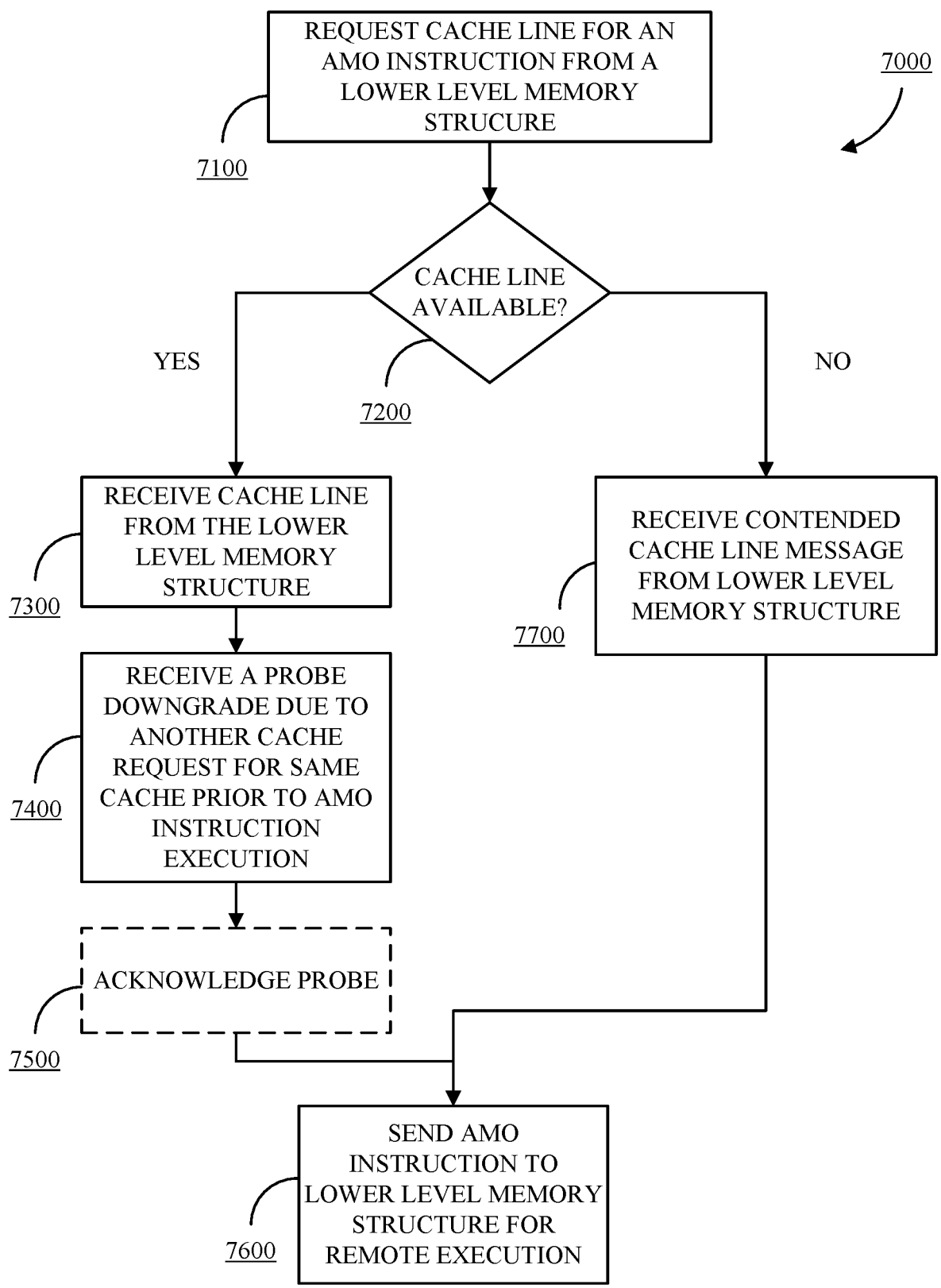
FIG. 7 is a flowchart of an example technique or method for implementing atomic memory operations with contended cache lines in accordance with embodiments of this disclosure.

FIG. 7 is a flowchart of an example technique or method 7000 for implementing atomic memory operations with contended cache lines in accordance with embodiments of this disclosure. The technique includes: requesting 7100 a cache line for an AMO instruction from a lower level memory structure; determining 7200 availability of the requested cache line; receiving 7300 the cache line from the lower level memory structure when available; receiving 7400 a probe downgrade due to another cache request for same cache line prior to AMO instruction execution; acknowledging 7500 the probe downgrade; sending 7600 the AMO instruction to the lower level memory structure for remote execution; receiving 7700 a contended cache line message from the lower level memory structure when not available; and sending 7600 the AMO instruction to the lower level memory structure for remote execution. The technique 7000 can be implemented, for example, in the processing system 1000 of FIG. 1 and like devices and systems.

The technique 7000 includes requesting 7100 a cache line for an AMO instruction from a lower level memory structure. A processor or processing system needs to execute an AMO operation. A local cache can request a cache line associated or needed for execution of the AMO instruction. In implementations, the local cache can request the cache line in the event of a cache miss. In implementations, the local cache can request a cache coherence state upgrade for the cache line in the event of a cache hit.

The technique 7000 includes determining 7200 availability of the requested cache line. The lower level memory structure can determine whether the requested cache line is a contended cache line based on a variety of factors, including, but not limited to, LRU, latency, matching a transaction in flight or buffered from the same cache or another cache, response by another memory structure which has the requested cache line, and the like.

The technique 7000 includes receiving 7300 the cache line from the lower level memory structure when available. The lower level memory structure can acquiesce to the request by providing the cache line to the local cache or by upgrading the cache coherence state upgrade of the cache line at the local cache.

The technique 7000 includes receiving 7400 a probe downgrade due to another cache request for same cache line prior to AMO instruction execution. Another cache can request the same cache lane resulting in a snoop probe downgrading the cache line at the local cache or invalidating the cache line at the local cache.

The technique 7000 includes acknowledging 7500 the probe downgrade. In implementations, the local cache can attempt to negotiate with the lower level memory structure.

The technique 7000 includes sending 7600 the AMO instruction to the lower level memory structure for remote execution. The local cache can forego local execution of the AMO operation and can send the AMO instruction to the lower level memory structure for remote execution. The AMO instruction can be executed by the lower level memory structure or other memory structure which is closer to a common root of sharing between the local cache and the other requesting cache that caused the snoop probe.

The technique 7000 includes receiving 7700 a contended cache line message from the lower level memory structure when not available. The lower level memory structure can send a message indicating that the requested cache line is a contended cache line and deny the request from the local cache.

The technique 7000 includes sending 7600 the AMO instruction to the lower level memory structure for remote execution.

In general, a processing system includes at least two cores, each core having a local cache, a lower level cache in communication with each local cache, One local cache configured to request a cache line to execute an atomic memory operation (AMO) instruction, receive the cache line via the lower level cache, receive a probe downgrade due to other local cache requesting the cache line prior to execution of the AMO, and send the AMO instruction to the lower level cache for remote execution in response to the probe downgrade. In implementations, the request is for the cache line in an event of a cache miss at the one local cache. In implementations, the request is for a cache coherence state upgrade in an event of a cache hit at the one local cache. In implementations, the lower level cache configured to determine an availability of the cache line based on a variety of factors. In implementations, the variety of factors includes at least a Least Recently Used (LRU) algorithm, latency, input from other caches or memory structures associated with the cache line, inclusive cache presence bits, matching a transaction in flight or buffered from another cache, whether the lower level cache has the cache line at all, whether the lower level cache has the cache line in a Shared or Unique coherence state, matching a probe from a later-level cache, matching an eviction from a lower level cache, a predictor table of recently-accessed cache lines that are likely to be contended, and a bloom filter of cache lines that are not likely to be contended. In implementations, the lower level cache is further configured to check with other caches or memory structures associated with the cache line regarding a willingness to give up the cache line. In implementations, the lower level cache is further configured to send a contended cache line message to the one local cache based on the variety of factors. In implementations, the one local cache is further configured to send the AMO instruction to the lower level cache for remote execution in response to the contended cache line message.

In general, a processing system includes a core with a local cache, a shared cache in communication with the local cache of the core and at least another cache of at least another core. The local cache configured to request a cache line to execute an atomic memory operation (AMO) instruction, receive a message from the shared cache that the cache line is unavailable, and send the AMO instruction to the shared cache for remote execution in response to the message. In implementations, the request is for the cache line in an event of a cache miss at the local cache. In implementations, the request is for a cache coherence state upgrade in an event of a cache hit at the local cache. In implementations, the shared cache configured to determine an availability of the cache line based on a variety of factors. In implementations, the variety of factors includes at least a Least Recently Used (LRU) algorithm, latency, input from at least the at least another cache of at least another core, and inclusive cache presence bits, matching a transaction in flight or buffered from another cache, whether the shared cache has the cache line at all, whether the shared cache has the cache line in a Shared or Unique coherence state, matching a probe from later-level cache, and matching an eviction from the shared cache. In implementations, the shared cache is further configured to check with the at least the at least another cache of the at least another core regarding willingness to give up the cache line.

In general, a method for executing atomic memory operation (AMO) instructions includes requesting, by a local cache, a cache line for an AMO instruction from a lower level memory structure, determining, by the lower level memory structure, availability of a requested cache line, receiving, by the local cache from the lower level memory structure, the cache line from the lower level memory structure when available, receiving a downgrade probe due to another cache request for the cache line prior to AMO instruction execution, sending, by the local cache to the lower level memory structure, the AMO instruction for remote execution in response to the probe downgrade, receiving, by the local cache from the lower level memory structure, a contended cache line message from the lower level memory structure when not available, and sending by the local cache to the lower level memory structure, the AMO instruction to the lower level memory structure for remote execution in response to the contended cache line message. In implementations, the request is for the cache line in an event of a cache miss at the local cache. In implementations, the request is for a cache coherence state upgrade in an event of a cache hit at the local cache. In implementations, the availability is based on a variety of factors including at least a Least Recently Used (LRU) algorithm, latency, input from other caches or memory structures associated with the cache line, inclusive cache presence bits, matching a transaction in flight or buffered from another cache, whether the lower level memory structure has the cache line at all, whether the lower level memory structure has the cache line in a Shared or Unique coherence state, matching a probe from a later-level memory structure, matching an eviction from the lower level memory structure. In implementations, the method further includes checking with other caches or memory structures associated with the cache line regarding willingness to give up the cache line. In implementations, the method further includes acknowledging, by the local cache, the downgrade probe.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more computer readable mediums having computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A processing system comprising:
    at least two cores, each core having a local cache;
    a lower level cache in communication with both local caches;
    one local cache configured to:
        request a cache line to execute an atomic memory operation (AMO) instruction;
        receive the cache line via the lower level cache, wherein the lower level cache is configured to determine availability of the cache line based on input from other caches or memory structures associated with the cache line;
        receive a probe downgrade due to a remaining local cache requesting the requested cache line prior to execution of the AMO; and
        send the AMO instruction to the lower level cache for remote execution in response to the probe downgrade.

2. The processing system of claim 1, wherein the lower level cache configured to determine an availability of the cache line also based on inclusive cache presence bits.

3. The processing system of claim 1, wherein the lower level cache configured to determine an availability of the cache line also based on matching a transaction in flight or buffered from another cache.

4. The processing system of claim 1, wherein the lower level cache configured to determine an availability of the cache line also based on whether the lower level cache has the cache line at all.

5. The processing system of claim 1, wherein the lower level cache configured to determine an availability of the cache line also based on whether the lower level cache has the cache line in a Shared or Unique coherence state.

6. The processing system of claim 1, wherein the lower level cache configured to determine an availability of the cache line also based on matching a probe from a later-level cache.

7. The processing system of claim 1, wherein the lower level cache configured to determine an availability of the cache line also based on matching an eviction from the lower level cache.

8. The processing system of claim 1, wherein the lower level cache configured to determine an availability of the cache line also based on a predictor table of recently-accessed cache lines that are likely to be contended.

9. The processing system of claim 1, wherein the lower level cache configured to determine an availability of the cache line also based on bloom filter of cache lines that are not likely to be contended.

10. The processing system of claim 1, wherein the lower level cache configured to determine an availability of the cache line also based on at least a Least Recently Used (LRU) algorithm.

11. The processing system of claim 1, wherein the lower level cache is further configured to:
    check with the other caches or memory structures associated with the cache line regarding a willingness to give up the cache line;
    send a contended cache line message to the one local cache based on a variety of factors; and
    send the AMO instruction for remote execution in response to the contended cache line message.

12. A processing system comprising:
    a core with a local cache;
    a shared cache in communication with the local cache of the core and at least another cache of at least another core;
    the local cache configured to:
        request a cache line to execute an atomic memory operation (AMO) instruction;
        receive a message from the shared cache that the requested cache line is unavailable, wherein the shared cache is configured to determine an availability of the cache line based on input from at least the at least another cache of the at least another core and inclusive cache presence bits; and
        send the AMO instruction to the shared cache for remote execution in response to the message.

13. The processing system of claim 12, wherein the shared cache configured to determine an availability of the cache line also based on latency, a Least Recently Used (LRU) algorithm, a predictor table of recently-accessed cache lines that are likely to be contended, and a bloom filter of cache lines that are not likely to be contended.

14. The processing system of claim 13, wherein the shared cache configured to determine an availability of the cache line also based on input from at least the at least another cache of the at least another core.

15. The processing system of claim 14, wherein the shared cache configured to determine an availability of the cache line also based on inclusive cache presence bits.

16. The processing system of claim 15, wherein the shared cache configured to determine an availability of the cache line also based on matching a transaction in flight or buffered from another cache.

17. The processing system of claim 16, wherein the shared cache configured to determine an availability of the cache line also based on whether the shared cache has the cache line at all.

18. The processing system of claim 17, wherein the shared cache configured to determine an availability of the cache line also based on whether the shared cache has the cache line in a Shared or Unique coherence state.

19. The processing system of claim 18, wherein the shared cache configured to determine an availability of the cache line also based on matching a probe from later-level cache and on matching an eviction from the shared cache.

20. A method for executing atomic memory operation (AMO) instructions, the method comprising:

requesting, by a local cache, a cache line for an AMO instruction from a lower level memory structure;

determining, by the lower level memory structure, availability of a requested cache line based on a Least Recently Used (LRU) algorithm and latency;

receiving, by the local cache from the lower level memory structure, the requested cache line from the lower level memory structure when available;

receiving a downgrade probe due to another cache request for the received cache line prior to AMO instruction execution, wherein the probe downgrade changes a cache coherency status of the cache line;

sending, by the local cache to the lower level memory structure, the AMO instruction for remote execution in response to the probe downgrade;

receiving, by the local cache from the lower level memory structure, a contended cache line message from the lower level memory structure when not available; and sending by the local cache to the lower level memory structure, the AMO instruction to the lower level memory structure for remote execution in response to the contended cache line message.

* * * * *